United States Patent
Koranne et al.

(10) Patent No.: US 8,677,300 B2
(45) Date of Patent: Mar. 18, 2014

(54) CANONICAL SIGNATURE GENERATION FOR LAYOUT DESIGN DATA

(75) Inventors: Sandeep Koranne, West Linn, OR (US); Bikram Garg, Patiala (IN)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/364,299

(22) Filed: Feb. 1, 2012

(65) Prior Publication Data

US 2013/0198712 A1     Aug. 1, 2013

(51) Int. Cl.
*G06F 17/50* (2006.01)

(52) U.S. Cl.
USPC ........... 716/119; 716/101; 716/106; 716/107; 716/139

(58) Field of Classification Search
USPC .......................... 716/101, 106, 107, 119, 139
See application file for complete search history.

(56) References Cited

U.S. PATENT DOCUMENTS

| | | | |
|---|---|---|---|
| 6,704,024 B2 * | 3/2004 | Robotham et al. | 345/581 |
| 6,976,020 B2 * | 12/2005 | Anthony et al. | 1/1 |
| 7,242,406 B2 * | 7/2007 | Robotham et al. | 345/581 |
| 7,688,327 B2 * | 3/2010 | Robotham et al. | 345/581 |
| 7,864,186 B2 * | 1/2011 | Robotham et al. | 345/581 |
| 2007/0058803 A1 * | 3/2007 | Suga | 380/30 |

* cited by examiner

*Primary Examiner* — Sun Lin

(57) ABSTRACT

Contour-related information for geometric elements in layout design data is obtained. Relevant portions of the contour-related information are provided to a canonical hash function, from which a canonical signature for the layout design data is generated.

5 Claims, 5 Drawing Sheets

CANONICAL SIGNATURE GENERATION FOR LAYOUT DESIGN DATA

RELATED APPLICATIONS

This application claims priority under 35 U.S.C. §119 to U.S. Provisional patent application Ser. No. 13/018,445, filed on Feb. 1, 2011, entitled "Canonical Layout Signature Generation For Layout Design Data," naming Sandeep Koranne and Bikram Garg as inventors, which application is incorporated entirely herein by reference.

FIELD OF THE INVENTION

The present invention relates to the unique identification of layout design data. Various implementations of the invention may be particularly useful for identifying when a first set of layout design data effectively matches a second set of layout design data.

BACKGROUND

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit being designed, its complexity, the design team, and the microcircuit fabricator or foundry that will manufacture the microcircuit. Typically, software and hardware "tools" will verify a design at various stages of the design flow by running software simulators and/or hardware emulators, and errors in the design are corrected.

Several steps are common to most design flows. Initially, the specification for the new microcircuit is transformed into a logical design, such as a register transfer level (RTL) description of the circuit. With this type of logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logical design of the circuit is then analyzed, to confirm that the operational logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design. The geometric elements define the shapes that will be created in various materials to actually manufacture the circuit device components (e.g., contacts, gates, etc.) making up the circuit. While the geometric elements are typically polygons, other shapes, such as circular and elliptical shapes, also may be employed. After the physical layout design has been finalized, it is then converted into a format that can be employed by a mask or reticle writing tool to create a mask or reticle for use in a photolithographic manufacturing process, or, alternately, into format that can be employed by an electron-beam writing tool in an electron beam manufacturing process.

The increasing cost of design and increased pressure on time-to-market schedules has given rise to design reuse, to the extent that a significant portion of an integrated circuit design may comprise reusable components. These reusable components are often referred to in the electronics field as "intellectual property" or "IP" components. IP components may be logical IP components incorporating logical design data, or they may be physical IP components incorporating physical layout design data. A microcircuit design company will typically license IP components from other parties, so most microcircuit design company will desire to track and manage their use to comply with the license agreements. On the other hand, companies that provide IP components seek to detect when their IP components are being infringed by uses outside of their license agreements.

This rapid proliferation of IP components has accelerated the dual problem of IP component tracking/management and IP component infringement detection. The exponential increase in the data set size of physical IP components in particular has increased the computational challenge of managing physical IP assets within an organization. With ever more emphasis on compliance requirements, the problem of tracking physical IP component layout data in, for example, Terabyte scale designs, with modest computational resources, in a timely and accessible manner, has come to the forefront.

To further complicate the tracking and management of physical IP components, a physical layout design typically will be hierarchically organized into discrete design portions or "cells." In some situations, an IP component may represent only a single cell in a larger hierarchical design. In other situations, an IP component may represent multiple cells of differing hierarchy. The proliferation of cells in both design and analysis processes has accelerated the need for cell tracking and identification based on physical layout data.

Various techniques have been employed to recognize cells or IP components in a design that match a given cell or IP component template. One commonly used set of techniques identifies matching cells or IP components based upon name recognition. These techniques are easily circumvented, even unintentionally, simply by changing the names of the cells in a design. Renaming of cells is frequently done for a number of reasons, including a desire to use a consistent internal naming convention, avoiding disclosure of trade secret sourcing information, etc.

Another set of techniques that have been employed to recognize matching cells (and thus IP components) employ geometry recognition. These techniques recognize similar geometric shapes and shape arrangements in layout data. One common geometry recognition technique, referred to as XOR checking, uses a layout XOR operation on the designs being compared. If the result of the XOR operation is substantially a null set, then the two designs substantially match. This technique is computationally expensive, however, and is not amenable to archival storage of layout signatures in a database. Further, this technique is difficult to employ if one cell being compared has been rotated or inverted relative to the other cell being compared. A variation of this technique uses some property of a cell, such as a bounding box for the cell or its layout area, to classify cells that are similar prior to performing an exhaustive XOR operation. This technique also suffers from the archival storage problem referenced above. Moreover, it is possible that a single rogue layer of data (deliberately inserted to obfuscate the comparison by a malicious adversary, for example) can prevent an XOR operation from being performed on otherwise matching cells.

Other techniques provide information describing the geometric elements into a canonical hash function to generate a signature. If the resulting signatures for two different cells are the same, then the cells are determined to be a match. These schemes suffer from a fundamental problem, however, in that conventional layout data representation formats are not canonical, and not order-dependent. That is, a geometric element can be represented as a point list, or as a collection of rectangles. Either representation results in the same photolithographic mask, but each would produce a substantially different hash signature. Further, a single geometric element may, in effect, match two or more separate geometric elements arranged to abut or overlap, but the single geometric element would produce a significantly different hash signature from the plurality of separate abutting or overlapping geometric elements.

Still other techniques use Fourier space transform to convert geometric element shapes to Fourier descriptors, which are canonical, and thus can be compared. These techniques require that the geometric elements be non-overlapping, however, and that the geometric elements in the designs being compared are ordered in the same direction (for example, from left-to-right). As noted, above, however, layout data sets typically are vector representations, and thus can be represented in many ways that cannot be compared even using Fourier descriptors.

DETAILED DESCRIPTION OF EMBODIMENTS OF THE INVENTION

Overview

Figure 1:
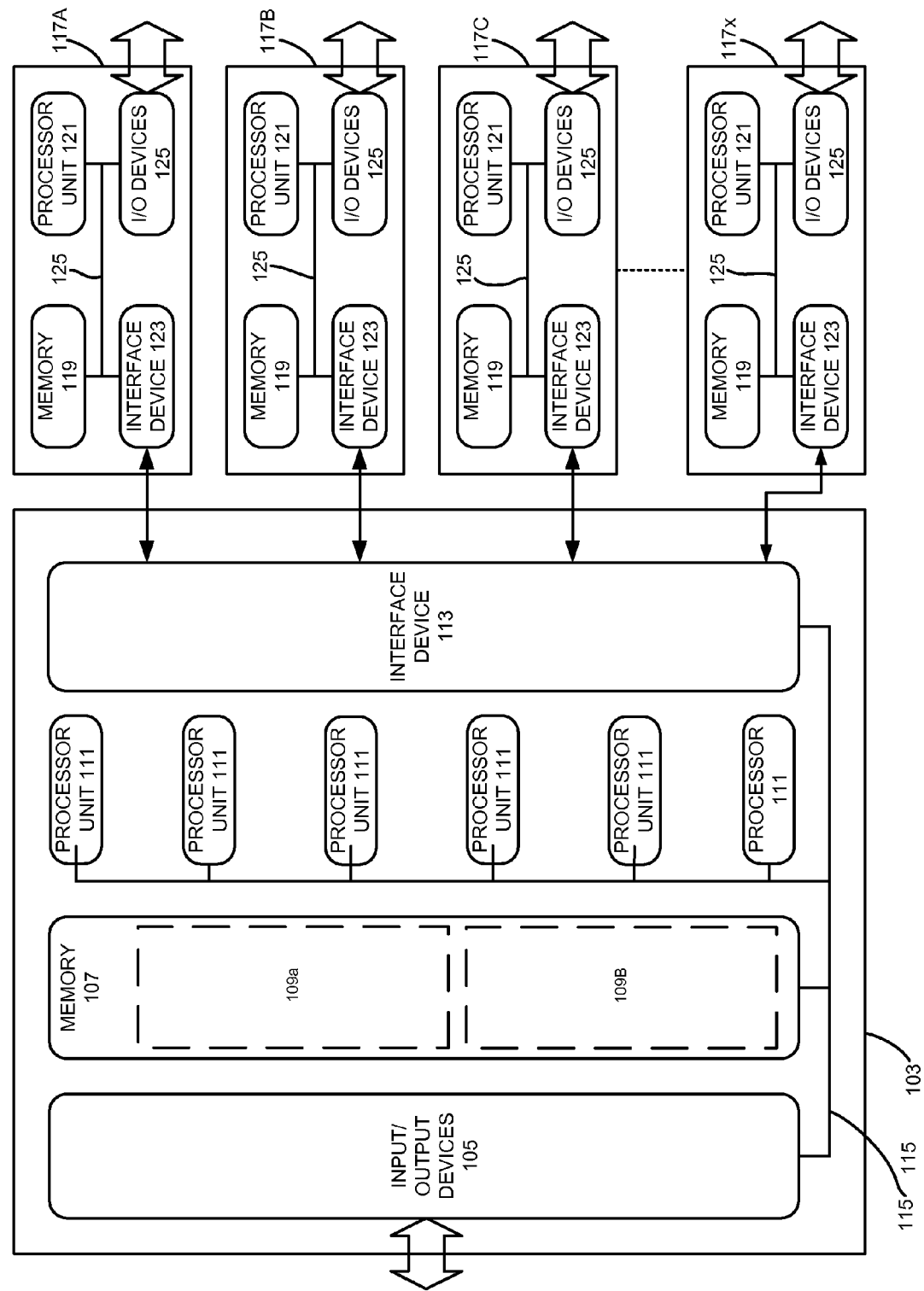
FIG. 1 illustrates an example of a computing system that may be used to implement various embodiments of the invention.

Various aspects of the present invention relate to the unique identification of layout design data. In the following description, numerous details are set forth for the purpose of explanation. However, one of ordinary skill in the art will realize that the invention may be practiced without the use of one or more of these specific details. In other instances, well-known features have not been described in details to avoid obscuring the present invention.

Some of the techniques described herein can be implemented in software instructions stored on a computer-readable medium storage device, software instructions executing on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms such as "derive," "generate" and "create" to describe the disclosed methods. These terms are high-level abstractions of the actual operations that are performed. The actual operations that correspond to these terms will vary depending on the particular implementation and are readily discernible by one of ordinary skill in the art.

As used herein, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device. Still further, the term "design" also is intended to encompass data describing more than one microdevice, such as data to be used to create a mask or reticle for simultaneously forming multiple microdevices on a single wafer. As will be discussed in more detail below, various implementations of the invention may be particularly relevant to the analysis and modification of layout design data. As used herein, layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Organization Of Data

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell"

might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells. While the above-described example is of cells with certain functionality, the term "cell" in this application is also intended to encompass data describing any portion of a circuit design designated as such for a hierarchical data arrangement.

By categorizing circuit design data into hierarchical cells, large data structures can be processed more quickly and efficiently. For example, a circuit designer typically will analyze a design to ensure that each circuit feature described in the design complies with design rules specified by the foundry that will manufacture microcircuits from the design. With the above example, instead of having to analyze each feature in the entire 128 kB memory array, a design rule check process can analyze the features in a single bit cell. The results of the check can then be applied to all instances of the single bit cell. That is, once it has confirmed that one instance of the single bit cells complies with the design rules, the design rule check process can complete the analysis of a register cell simply by analyzing the features of its additional miscellaneous circuitry (which may itself be made of up one or more hierarchical cells). The results of this check will in turn be applicable to all of the register cells. Once it has confirmed that one instance of the register cells complies with the design rules, the design rule check process can complete the analysis of the entire 128 kB memory array simply by analyzing the features of the additional miscellaneous circuitry in the memory array. Thus, the analysis of a large data structure can be compressed into the analyses of a relatively small number of cells making up the data structure.

With various examples of the invention, layout design data will include two different types of data: "drawn layer" design data and "derived layer" design data. The drawn layer data describes geometric features that will be used to form structures in layers of material to produce the integrated circuit. For example, the drawn layer data will usually include polygons corresponding to the structures that will be formed by a manufacturing process in metal layers, diffusion layers, and polysilicon layers. The derived layers will then include features made up of combinations of drawn layer data and other derived layer data.

For example, a design rule check process typically will perform two types of operations: "check" operations that confirm whether design data values comply with specified parameters, and "derivation" operations that create derived layer data. Transistor gate design data thus may be created by the following derivation operation:

gate=diff AND poly

The results of this operation will be a derived "layer" of data identifying all intersections of diffusion polygons in a drawn layer with polysilicon polygons in another drawn layer (i.e., transistor gates). Likewise, p-type transistor gates, formed by doping the diffusion layer with n-type material, are identified by the following derivation operation:

pgate=nwell AND gate

The results of this operation then will be another derived "layer" of data identifying all transistor gates (i.e., intersections of diffusion layer polygons with polysilicon layer polygons) where the polygons in the diffusion layer have been doped with n-type material.

Illustrative Operating Environment

The execution of various electronic design automation processes according to embodiments of the invention may be implemented using computer-executable software instructions executing on one or more programmable computing devices, by computer-executable instructions stored on computer readable storage device, or some combination thereof. Further, because of the complexity of some electronic design automation processes and the large size of many circuit designs, some embodiments of the invention may implemented with a computing system capable of simultaneously running multiple processing threads in parallel. Accordingly, the components and operation of an illustrative programmable computer system having a host or master computer and one or more remote or servant computers in particular are described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable storage devices that can be accessed by the master computer 103. The computer readable storage devices may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, holographic storage devices, or any medium that can be used to store desired information in a non-transitory manner (i.e., that stores information for a period longer than required to simply propagate the information from its origin location to a desired destination location).

As will be discussed in detail below, the master computer 103 may be used to execute a software application for performing one or more operations according to various examples of the invention. Accordingly, the memory 107 stores computer-executable software instructions 109A that, when executed, will implement a software application for performing one or more operations. The memory 107 also stores data 109B to be used with the software application. In the illustrated example, the data 109B contains process data that the software application uses to perform operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
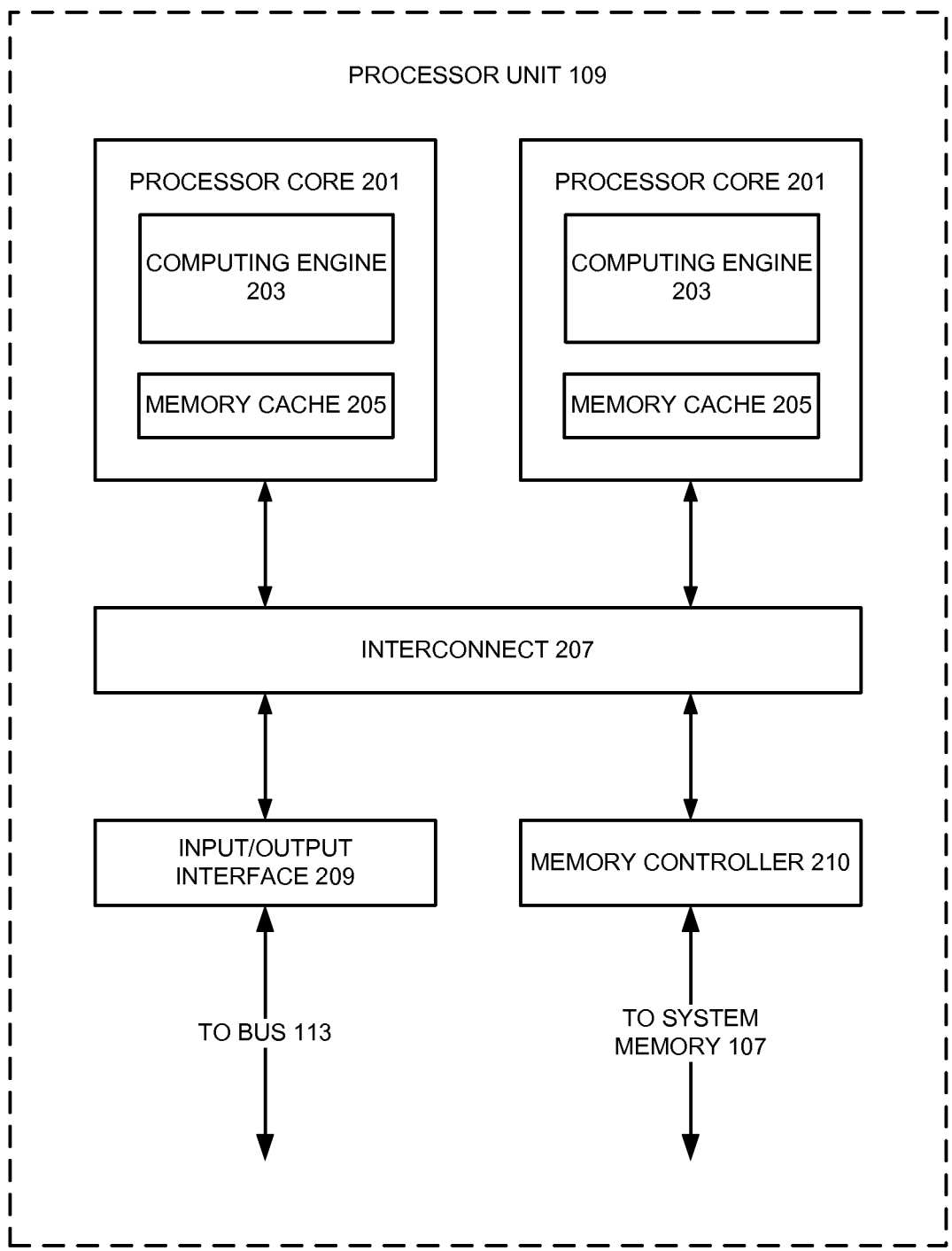
FIG. 2 illustrates an example of a multi-core processor unit that may be used to implement various embodiments of the invention.

For some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed with some embodiments of the invention, it should be appreciated that this illustration is representative only, and is not intended to be limiting. It also should be appreciated that, with some implementations, a multi-core processor unit 111 can be used in lieu of multiple, separate processor units 111. For example, rather than employing six separate processor units 111, alternate implementations of the invention may employ a computer systems with a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), or the Internet protocol (IP). These and other conventional communication protocols are well known in the art, and thus will not be discussed here in more detail.

Each servant computer 117 typically includes a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, or printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having a single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable storage media medium that can be used to store desired information in a non-transitory manner (i.e., that stores information for a period longer than required to simply propagate the information from its origin location to a desired destination location. The computer readable storage devices may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, punched media, or holographic storage devices. Also, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of embodiments of the invention.

Scan Line Analysis

With various examples of the invention, contour-related information for geometric elements in layout design data is obtained using a scan line technique. This technique sequentially processes geometric edge information occurring along a line in the layout design data along a single direction, such as from left to right, top to bottom, etc. In various examples of the invention, the scan line captures data at every edge end point and every intersection of edges. These data capture points are referred to as scan stops. Typically, each scan stop will occur at the intersection of two or more edges for bounded geometric elements. While some implementations of the invention may employ a scan line that sequentially moves through each portion of the design data, still other implementations of the invention may use a "discrete" scan line that jumps directly from scan stop to scan stop.

With this arrangement, the scan line analysis captures state data at each scan stop that can be used to uniquely determine the contours of the geometric elements in the input layout data. For example, according to some implementations of the invention, the state data obtained by the scan line analysis comprises the number of geometric element edges intersecting the scan line, their relative order on the scan line, and the order of their insertion and deletion. Thus, given an input edge segment between Cartesian coordinate values $(x_1, y_1,)$ and $(x_2, y_2)$ that is inserted into the scan line when the scan line is along the coordinate value $x_1$, the state of the edge segment may be denoted by a tuple #S(n, m, p, o). In this tuple, n denotes the number of segments that have already been inserted into the scan line, m denotes the number of segments currently active in the scan line (i.e., currently intersecting the scan line), p denotes the intersection vector of m with the scan line, and o denotes the set of endpoints for the edge segments.

Figure 3:
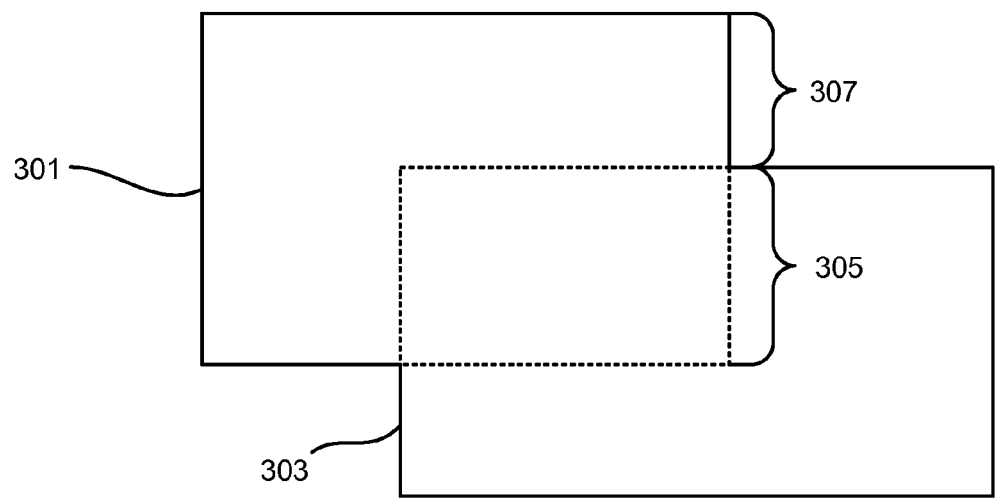
FIG. 3 shows a line segment inside of an outer contour of a plurality of overlapping geometric elements, and a line segment along an outer contour of the plurality of overlapping geometric elements.

As previously noted, the tuple value p is the intersection vector of m with the scan line (which may be referred to as a "lap count"). This value, which may be stored in a record of size m, indicates when a scan stop is inside of the contour of a geometric element or plurality of abutting or overlapping geometric elements. That is, because this value is based upon the direction of a bounded shape relative to its intersecting edge, (e.g., the bounded shape extends "upward" from the edge or "downward" from the edge, based upon the intersection of the endpoint of the edge with another edge of the bounding shape), it will indicate whether an edge segment is inside of the contour formed by a geometric element or plurality of abutting or overlapping geometric elements, or if the edge segment is a part of the contour formed by a geometric element or plurality of abutting or overlapping geometric elements. For example, FIG. 3 shows a plurality of overlapping geometric elements 301, 303. In this figure, edge segment 305 (shown with a dotted line) occurs inside of the contour of the overlapping geometric elements 301, 303 (shown with a solid line), while edge segment 307 occurs along the contour of the overlapping geometric elements 301, 303.

The value of m then can be used to keep track of when a value of p for an edge must be updated at a scan stop. For example, when the scan line moves from left to right, the value of p for an edge below a new edge inserted into the scan line does not need to be updated, while the values of p for an edge below a new edge inserted into the scan line does. The value of o then denotes the set of endpoints of the edge segments. With various embodiments of the invention, before contour edge segment (i.e., an edge segment that is a part of the contour formed by a geometric element or plurality of abutting or overlapping geometric elements) is discarded from the scan line, characteristics of that edge segment, such as the value of o (which reflect the coordinate values for each end point of that edge segment) is stored for use in generating a hash signature.

With some implementations, the tuple may optionally further include a value s denoting a transform for encoding the values of o. This transform can be used, for example, to make a contour subjected to an optical proximity correction (OPC) process equivalent to the contour before the optical proximity correction (OPC) process. Typically, this will be a local transformation that may use only layout data information available to the scan line. With various implementations of the invention, the transform will be based upon what a known OPC process will do to the edges of a given geometric element or elements. The transform thus may create additional vertices or remove vertices from scanned edges, depending upon the direction of the transform (i.e., from a pre-OPC contour to a post-OPC contour, or from a post-OPC contour to a pre-OPC contour). For example, a transform for determining the pre-OPC contour formed by a geometric element or plurality of abutting or overlapping geometric elements from its post-OPC contour may be obtained by simulating the printing of the post OPC-contour in a lithographic process, and then "snapping" the edges of the simulated print results to a grid. If the OPC process was effective, the snapped print results will correspond to the pre-OPC contour formed by that geometric element or plurality of abutting or overlapping geometric elements.

As will be appreciated by those of ordinary skill in the art, the contour-related information described by the tuple #S(n, m, p, o) or the tuple #S(n, m, p, o, s) represents a finite-state machine that processes input data edge segment information of layout design data and produces output edge segment information. A useful mathematical property of the scan line technique described above is that the set o is independent of the input data ordering and vector shape.

With various examples of the invention, the values of the tuple will not be retained, but may instead simply be updated at each scan stop. The current tuple state will thus reflect the status of the data captured by the scan line up at that point. Alternately or additionally, various implementations of the invention may employ a compression scheme to reduce the size of the output data produced by the scan line process.

Generation of a Signature

With various implementations of the invention, some or all of the contour-related information obtained for the layout data is used to generate a signature value. For example, with some embodiments of the invention, end point coordinate values of edge segments making up the contours of geometric elements (and pluralities of abutting or overlapping geometric elements values) may fed into a hash function to produce a signature value. Thus, if the contour-related information is described by the tuple #S(n, m, p, o) (or the tuple #S(n, m, p, o, s)), then the values of the tuple o (or values of the tuple o that have been transformed by the transform s) may be fed into a hash function to produce a signature value. With some implementations of the invention, the direction that the edge segment faces relative to the geometric element or plurality of abutting or overlapping geometric elements that it bounds also may be provided to the hash function with the end-point coordinate values.

Different implementations of the may employ any substantially canonical hash function. For example, some embodiments of the invention may employ the MD5 cryptographic hash function to generate signature values. As will be discussed in more detail below, the signatures produced by the hash function for various hierarchical cells in the design can be compared with the signatures produced from layout design data from other sources. If the signatures for two sets of layout design data are the same, then it can be concluded that both sets of layout design data substantially match.

Signature Generation Tool

Figure 4:
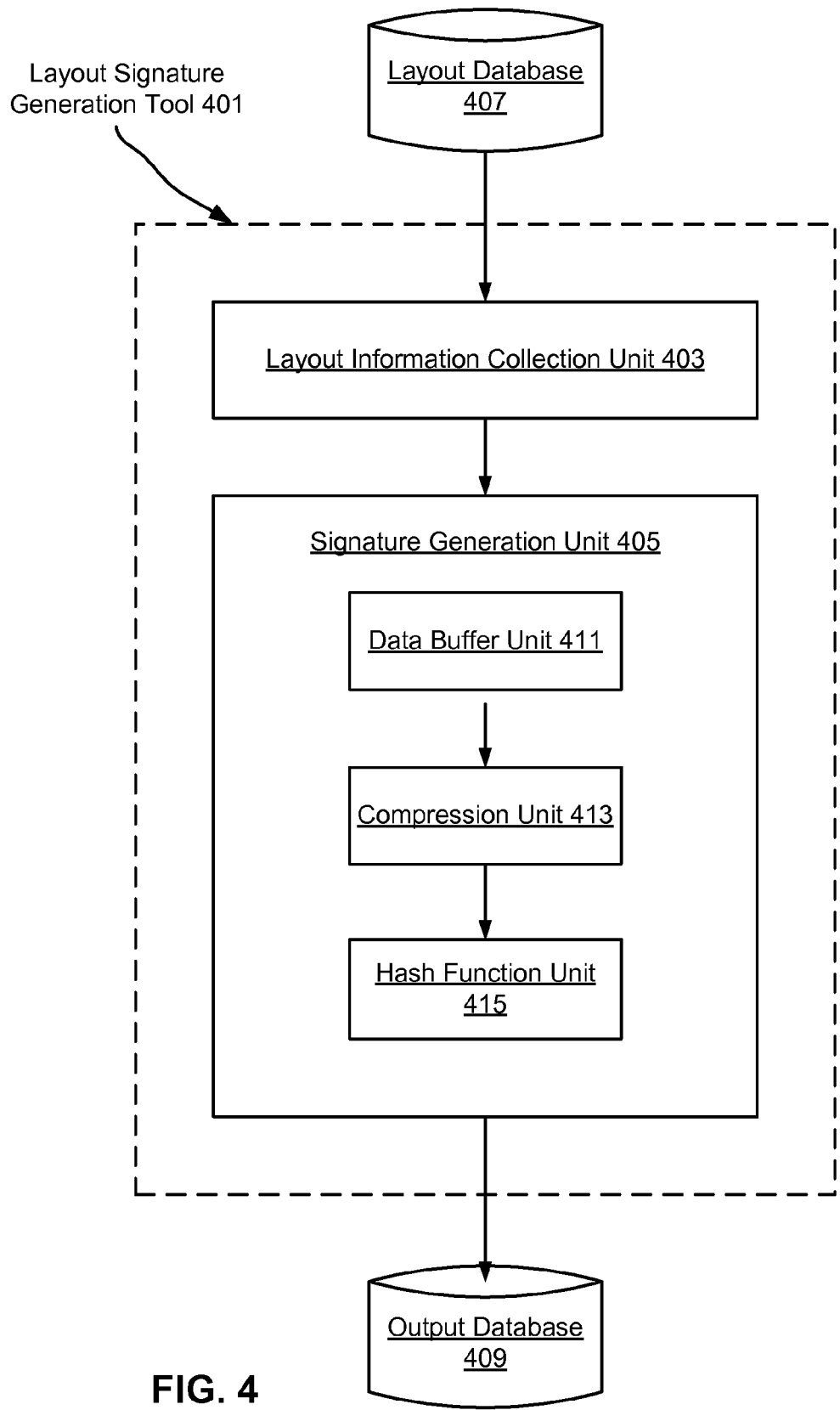
FIG. 4 illustrates an example of a layout signature generation tool that may be implemented according to various embodiments of the invention.

FIG. 4 illustrates an example of a layout signature generation tool 401 that may be implemented according to various embodiments of the invention. As seen in the figure, the layout signature generation tool 401 includes a layout information collection unit 403 and a signature generation unit 405. As also shown in this figure, various implementations of the layout signature generation tool 401 may cooperate with (or incorporate, in whole or part) a layout database 407 and an output database 409. With various implementations of the invention, the signature generation unit 405 includes a data buffer unit 411, a compression unit 413 and a hash function unit 415, as also illustrated in FIG. 4

Initially, the layout signature generation tool 401 receives layout data from the layout database 407. In response, the layout information collection unit 403 collects contour-related information regarding the geometric elements in the layout, as described in detail above. With various implementations of the invention, the layout information collection unit 403 may employ a scanline process to obtain the contour-related information, as also described in detail above. Of course, with still other implementations of the invention the layout information collection unit 403 may employ any suitable technique for obtaining the contour-related information. The layout information collection unit 403 then sends the relevant portion of the collected contour-related information to the signature generation unit 405.

The data buffer unit 411 temporarily stores data received from the layout information collection unit 403. As will be appreciated by those of ordinary skill in the art, any suitable type of conventional data buffering system may be used to implement the data buffer unit 411. For example, the data buffer unit 411 may be implemented by a hardware circuit, software being executed on a programmable processing unit (such as a microprocessor), or some combination of both. Once the data buffer unit 411 is full, the stored contour-related information is compressed by the compression unit 413. Again, any suitable type of conventional compression system may be used to implement the compression unit 413. For example, the compression unit 413 may be implemented by a hardware circuit, software being executed on a programmable processing unit (such as a microprocessor), or some combination of both.

The compressed contour-related information then is provided to the hash function unit 415. As discussed in detail above, the hash function unit 415 employs a hash function to generate a signature for the layout design data from the provided contour-related information. With various implementations of the invention, the hash function unit 415 will employ a hash function that generates a canonical signature, such as the MD5 cryptographic hash function (or variants of the MD5 cryptographic hash function). This cryptographic hash function is well known in the art, and thus will not be discussed in more detail here. It should be appreciated by those of ordinary skill in the art, however, that various implementations of the invention may employ other hash functions and even other signature functions that may not mathematically be considered hash functions to generate a canonical signature for the layout design data. The generated signature may then be stored in the output database 409, for subsequent comparison with, for example, signatures generated from other sets of layout design data.

With various embodiments of the invention, each of the layout information collection unit 403, the data buffer unit 411, the compression unit 413, and the hash function unit 415 may be implemented by a hardware circuit, software being executed on a programmable processing unit (such as a microprocessor), or some combination of both. In some embodiments, a single programmable processing unit may implement two or more of the units sequentially, while other embodiments may alternately or additionally employ multiple programmable processing units to implement two or more of the units in parallel. The layout database 407 and the output database 409 may be implemented using any conventional data storage device suitable for storing layout design data and signature information associated with layout design data, respectively.

It also should be appreciated by those of ordinary skill in the art that FIG. 4 illustrates only one configuration of a layout signature generation tool 401 that can be provided according to various embodiments of the invention. For example, while each of the layout information collection unit 403, the data buffer unit 411, the compression unit 413, and the hash function unit 415 are described herein as separate components, alternate implementations of the layout signature generation tool 401 may combine the functionality of two or more of these units, further separate the functionality of one or more of these units, or otherwise reconfigure the functionality of these units into a different arrangement of units. With still other implementations, the signature generation unit 405 may omit the data buffer unit 411, the compression unit 413, or both. Similarly, while the layout database 407 and the output database 409 are described herein as being separate storage facilities, alternate implementations of the invention may include or employ a combined data storage facility or three or more data storage facilities to provide the functionality of the layout database 407 and the output database 409.

Hierarchical Analysis

As previously noted, most conventional circuit designs employ a hierarchical organization. Accordingly, a cell in a layout design may itself include one or more child cells, which in turn may include child cells of various dependencies. In many cases, generating a signature for a cell may need to take into account any lower-level cells incorporated into the cell being analyzed. With some implementations, the lower-level cells may be flattened in order to include the geometric information in those lower-level cells when generating the signature. As will be appreciated by those of ordinary skill in the art, however, this approach may be very time consuming and computationally expensive. Still other implementations of the invention, however, may generate a signature while preserving the advantages provided by the hierarchal organization embodied in the analyzed cell.

Figure 6:
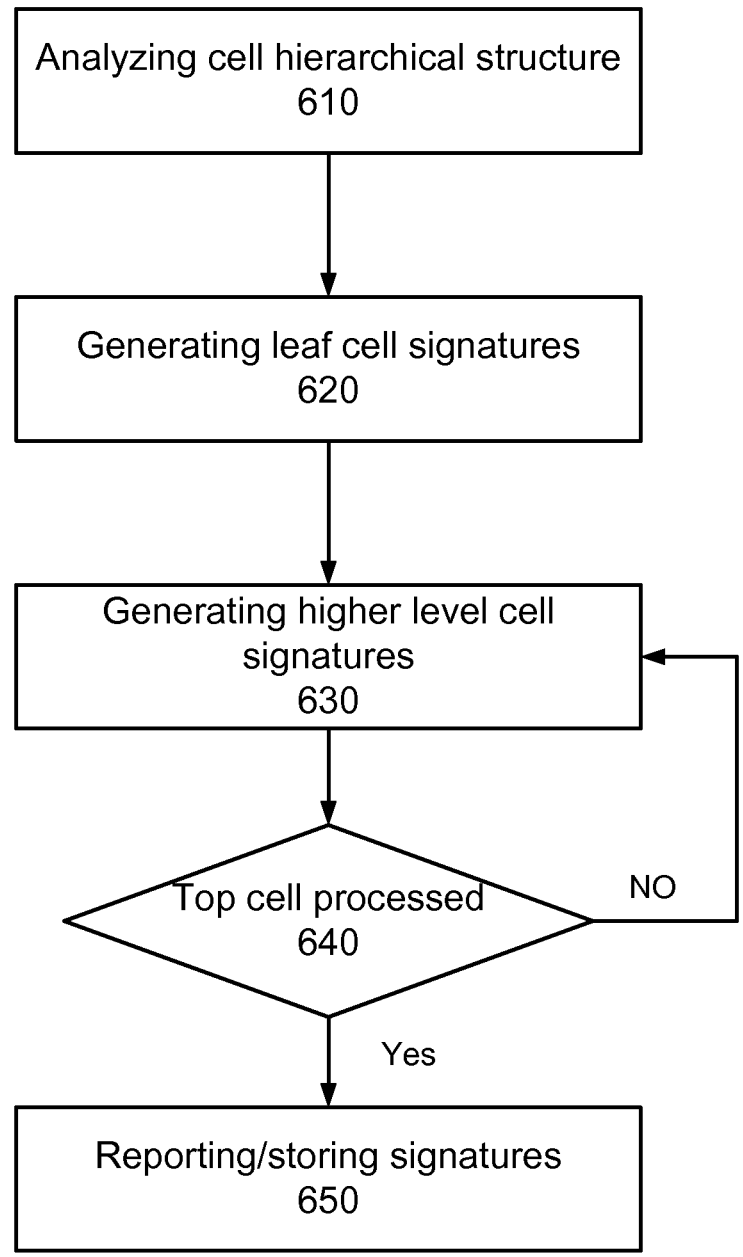
FIG. 6 illustrates a flowchart describing a process for generating signatures for cells in a layout design according to various embodiments of the invention.

FIG. 6 illustrates a flowchart describing a process for generating signatures for cells in a layout design that takes into account a hierarchical organization. As will be explained in more detail below, various implementations will generate cell signatures for a layout design in a bottom-to-top order. That is, various implementations of the invention will generate cell signatures only for cells that include lower-level cells for which a signature has already been generated.

Figure 5:
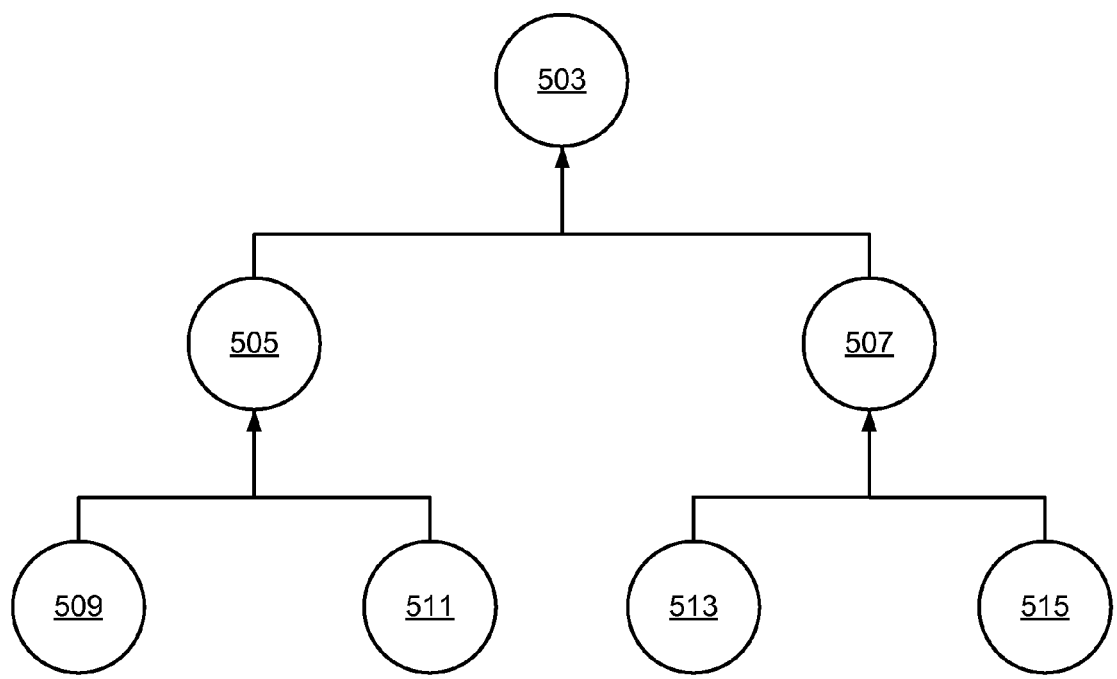
FIG. 5 illustrates an example of a hierarchical arrangement of layout design data.

Accordingly, in operation 610, the hierarchical organization of a cell is analyzed. In some embodiments, to facilitate the hierarchical analysis, a cell directed acyclic graph (cell DAG) may be constructed as illustrated in FIG. 5. In FIG. 5, cell 503 is the top-level cell. The cell 503 includes two child-level cells, cell 505 and cell 507. Each of the two child-level cells also has its own child-level cells: cell 509 and cell 511 depending from cell 505, and cell 513 and cell 515 depending from cell 507. These bottom-level cells, cells 509-515, are often called "leaf" cells since they do not include any other cells. The cells between the top-level cell and the leaf cells will be referred to as "branch" cells hereafter. Thus, in FIG. 5, cells 505 and 507 are branch cells. The hierarchical organization shown in FIG. 5 is only an example. It should be appreciated that the process described in FIG. 6 can be applied to a cell with different hierarchical organizations. Still further, a cell DAG may not be needed. The hierarchical organization may be illustrated in other ways.

Once the hierarchical organization is analyzed, operation 620 generates leaf cell signatures. The generation process is the same as described in detail above. Briefly, using the scanline technique and a hash function, operation 620 first generates drawn layer signatures for one or more selected drawn layers for each leaf cell. The generated drawn layer signatures for a leaf cell are combined together to generate a leaf cell signature. With some implementations of the invention, the same hash function may be used to combine the generated drawn layer signatures.

In operation 630, signatures are generated for cells in the next higher level which may be branching cells or the top level cell. As the whole process is in a bottom-to-top order, the branching cells on the level immediately above the leaf cells are first considered. In FIG. 5, for example, the branching cells are cells 505 and 507. Again, the process is the same as described in detail above. Drawn layer signatures for the selected one or more drawn layers for each of the branch cells are generated.

In various implementations of the invention, each of the branching cells and the top level cell has an instance layer. The instance layer of a cell shows placement, transformation and array information of the child cells in the cell. In the case of cell 505 in FIG. 5, its instance layer includes information about the placement, transformation and array information of cell 509 and cell 511 within cell 505. For cell 507, its instance layer includes information about the placement, transformation and array information of cell 513 and cell 515 within cell 507.

A signature may be generated for the instance layer and is referred to as the instance layer signature. With various implementations of the invention, the instance layer signature is generated in a way similar to how a drawn layer signature is generated. The scan line technique and a hash function are used to collect the placement, transformation and array information of the child cells.

Based on the generated drawn layer signatures and instance layer signature, a signature for the branching cells or the top cell may be generated using the hash function. In some embodiments of the invention, signatures for all the drawn layers and the instance layer are combined by the hash function to generate the signature for the top level cell. In other embodiments of the invention, two or more signatures for selected drawn layers and/or the instance layer may be combined by the hash function to generate the signature for the top level cell. In still other embodiments of the invention, no such signature is generated. Instead, signatures for one or more drawn layers and/or the instance layer are used for the top level cell.

Operation 640 determines whether a signature for the top level cell has been generated. If the answer is no, the process goes back to operation 630. Otherwise, operation 650 is performed. In operation 650, the generated signature for the top-level cell is either reported to users or stored in a processor-accessible storage medium or both. Intermediate results such as signatures for the child cells and drawn/derived layers may also be reported or stored or both. Various methods may be used for reporting to users, such as displaying the result on a screen and printing out the result. The signature may also be stored with the cell for various applications.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims and described herein.

What is claimed is:

1. A method for creating a signature for a portion of layout data, comprising;
   employing a computer to produce contour-related information for geometric elements in a portion of layout data based upon a rasterizing scanline analysis of the portion of the layout data; and
   employing a computer to generate a signature based upon the contour-related information and a mathematical function.

2. The method recited in claim 1, further comprising employing a computer to generate a second signature for a second portion of layout data that includes a first portion of the layout data, which is the portion of the layout data considered in claim 1.

3. The method recited in claim 2, wherein
   said employing a computer to generate a second signature includes:
   employing a computer to produce second contour-related information for geometric elements in the second portion of the layout data based upon a rasterizing scanline analysis of the second portion of layout data outside of the first portion of the layout data; and
   employing a computer to generate a second signature based upon the second contour-related information and a first signature for the first portion of the layout data.

4. The method recited in claim 2, wherein the first portion of the layout data is a hierarchal cell placed within the second portion of the layout data.

5. The method recited in claim 1, wherein
   said employing a computer to produce contour-related information for geometric elements in a portion of layout data includes:
   employing a computer to produce first contour-related information for geometric elements in a first layer of the portion of the layout data, and
   employing a computer to produce second contour-related information for geometric elements in a second layer of the portion of the layout data; and said employing a computer to generate a signature includes:
  employing a computer to generate a first layer signature based upon the first contour-related information and a first mathematical function,
  employing a computer to generate a second layer signature based upon the second contour-related information and a second mathematical function, and
employing a computer to generate the signature from the first layer signature, the second layer signature, and a third mathematical function.

* * * * *